(12) United States Patent
Chen et al.

(10) Patent No.: US 7,547,584 B2
(45) Date of Patent: Jun. 16, 2009

(54) METHOD OF REDUCING CHARGING DAMAGE TO INTEGRATED CIRCUITS DURING SEMICONDUCTOR MANUFACTURING

(75) Inventors: Ko-Ting Chen, Nan-Tou Hsien (TW); Wen-Bin Lu, Hsin-Chu (TW); Chao-Hu Liang, Hsin-Chu (TW)

(73) Assignee: United Microelectronics Corp., Hsin-Chu (TW)

( * ) Notice: Subject to any disclaimer, the term of this patent is extended or adjusted under 35 U.S.C. 154(b) by 150 days.

(21) Appl. No.: 11/560,831

(22) Filed: Nov. 16, 2006

(65) Prior Publication Data
US 2007/0093057 A1   Apr. 26, 2007

Related U.S. Application Data

(63) Continuation-in-part of application No. 10/908,815, filed on May 27, 2005, now Pat. No. 7,176,051.

(51) Int. Cl.
*H01L 21/44* (2006.01)
(52) U.S. Cl. .................. 438/128; 438/462; 438/638; 438/710; 438/453
(58) Field of Classification Search .......... 438/113, 438/401, 421, 453, 66, 68, 627, 512, 523, 438/584, 462, 638, 510, 533, 710, 128
See application file for complete search history.

(56) References Cited

U.S. PATENT DOCUMENTS

| 5,998,282 | A | 12/1999 | Lukaszek |
| 6,521,487 | B1* | 2/2003 | Chen et al. ................. 438/133 |
| 7,176,051 | B2* | 2/2007 | Chen et al. ................... 438/68 |
| 7,259,091 | B2* | 8/2007 | Schuehrer et al. ........... 438/627 |
| 2006/0006538 | A1* | 1/2006 | Allman et al. ............... 257/758 |
| 2008/0174022 | A1* | 7/2008 | Chen et al. .................. 257/752 |

OTHER PUBLICATIONS

U.S. Appl. No. 10/908,815, filed May 27, 2005, Ko-Ting Chen et al.

\* cited by examiner

*Primary Examiner*—Savitri Mulpuri
(74) *Attorney, Agent, or Firm*—Winston Hsu

(57) ABSTRACT

An integrated circuit die includes thereon a first device region, a second device region and a non-active region. A first implant mask, which covers the second device region and the non-active region, while exposing the first device region, is formed over the semiconductor substrate. Dopant species are implanted into the exposed semiconductor substrate within the first device region to form first doping regions therein. A second implant mask is formed over the semiconductor substrate. The second implant mask covers the first device region, while exposing the second device region and a portion of the non-active region. Dopant species are implanted into the exposed semiconductor substrate within the second device region to form second doping regions therein.

6 Claims, 13 Drawing Sheets

METHOD OF REDUCING CHARGING DAMAGE TO INTEGRATED CIRCUITS DURING SEMICONDUCTOR MANUFACTURING

CROSS REFERENCE TO RELATED APPLICATIONS

This is a continuation-in-part of U.S. patent application Ser. No. 10/908,815, filed May 27, 2005.

BACKGROUND OF THE INVENTION

1. Field of the Invention

The present invention relates generally to the field of semiconductor fabrication and, more particularly, to a method of reducing charging damage to integrated circuits during semiconductor manufacturing. The present invention is particularly suited for ion implant processing in an ion implanter without employing a plasma flood system.

2. Description of the Prior Art

Ion implanters and ion implant process are commonly used in the manufacture of semiconductor products for implanting dopant species into wafers or semiconductor substrates to change the conductivity of the material in such substrates. Ion implanters generally comprise an ion source for generating a beam of ions, a mass analyzer for selecting a particular species of ions from the ion beam and means to direct the mass-selected ion beam through a vacuum chamber onto a target substrate supported on a substrate holder. A high-current ion implanter usually encompasses a plasma flood system used to neutralize positive ions.

Influence of ion implant process on wafers has been investigated. It has been revealed that when processing a wafer in plasma ambient or ion implant process environment, charging damage occurs due to surface charge build-up. Such charging damage to integrated circuits can result in costly losses of product.

Typically, damage to thin insulators such as gate oxide sandwiched between a conductive substrate and isolated conductive electrodes on the surface of a wafer (gates) occurs due to current flow through the insulator, driven by a potential difference between the surface electrode and the substrate. During wafer processing, wafer-scale potential differences are caused by global non-uniformities in plasma density and/or electron temperature or, in the case of ion-beam equipment, by spatially imperfect neutralization of the charging caused by the ion beam.

When devices are under the beam in a high-current ion implanter, they are exposed to positive charging from the high-energy ion beam, from "slow" ions (ionized background gases or the plasma used for charge neutralization), and from secondary electrons emitted from the surface of the wafer due to ionic impact. They are also exposed to negative charging from the "electron shower" or the plasma electrons from a plasma flood system used to neutralize positive charging. Therefore, the net positive charging when devices are under the beam is the sum of the positive and negative charging.

Lukaszek in U.S. Pat. No. 5,998,282 describes a method of reducing charging damage to integrated circuits in ion implant and plasma-based integrated circuit process equipment. Charging damage to integrated circuits during ion implantation and plasma processing of integrated circuit die in a semiconductor wafer is reduced by processing scribe lanes during wafer fabrication to facilitate the flow of current to and from the wafer substrate through the scribe lanes during integrated circuit fabrication and reduce current flow through integrated circuit components. Lukaszek also reveals that increasing shunt path current flow within the integrated circuit die is difficult due to circuit layout constraints.

SUMMARY OF THE INVENTION

It is the primary object of the present invention to provide an improved method of reducing charging damage to integrated circuits during semiconductor manufacturing, wherein the difficulty of increasing shunt path current flow within the integrated circuit die is overcome.

In accordance with the claimed invention, a method of reducing charging damage to integrated circuits during semiconductor manufacturing is disclosed. A semiconductor substrate comprising thereon a number of integrated circuit dies is provided. The integrated circuit dies are separated from each other by scribe lanes surrounding each integrated circuit die. Each integrated circuit die comprises thereon at least a first device region, a second device region and a trench isolation dummy region. A first implant mask is formed over the semiconductor wafer, the first implant mask covers the second device region and the trench isolation dummy region, while exposing the semiconductor substrate within the first device region. Dopant species are implanted into the exposed semiconductor substrate within the first device region to form first doping regions therein. The first implant mask is stripped off. A second implant mask is formed over the semiconductor wafer. The second implant mask covers the first device region, while exposing the semiconductor substrate within the second device region and a plurality of trench dummy features of the trench isolation dummy region. Dopant species are implanted into the exposed semiconductor substrate within the second device region to form second doping regions therein.

From one aspect of this invention, the claimed invention method includes the steps of providing a semiconductor substrate comprising thereon a number of integrated circuit dies, the integrated circuit dies being separated from each other by scribe lanes surrounding each integrated circuit die, wherein the semiconductor substrate comprises thereon a dielectric layer; forming a mask over the dielectric layer, the mask comprising a first opening defining an interconnection pattern and a second opening defining a dummy pattern, wherein the first and second openings both are formed within each integrated circuit die; performing a plasma etching process to etch the dielectric layer through the first and second openings of the mask, thereby forming an interconnection recessed feature and a recessed dummy feature in the dielectric layer; and filling the interconnection recessed feature and the recessed dummy feature with conductive materials to form an interconnection feature and a dummy feature, wherein the interconnection feature electrically connects to an underlying conductive layer, while the dummy feature is floating or grounded to the semiconductor substrate.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

Figure 1:
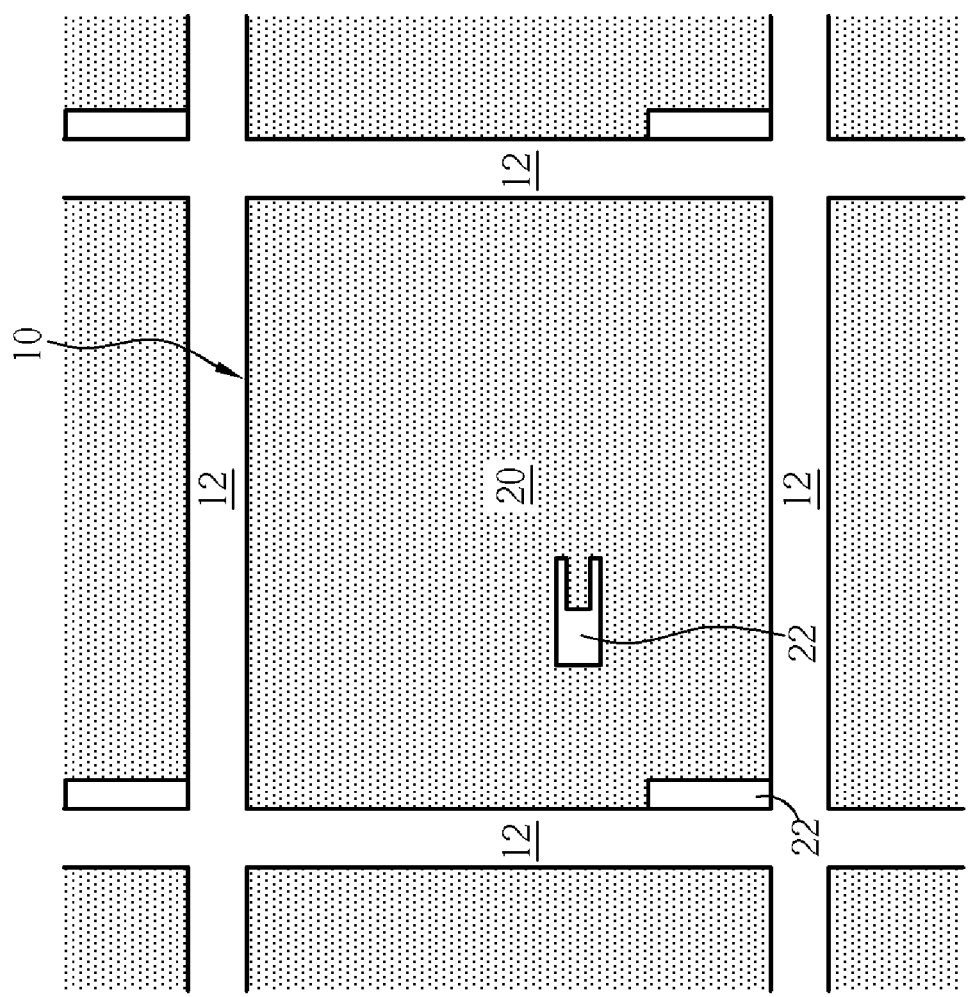
FIG. 1 is a schematic plan view of layout of a photoresist implant mask for implementing lightly doped drain (LDD) regions of high-voltage devices in an integrated circuit die.

In describing the preferred embodiment of the present invention, reference will be made herein to FIGS. 1-2 of the drawings. Features of the invention are not drawn to scale in the drawings.

As previously described, high-current ion implanters are typically equipped with a plasma flood gun, which is an effective apparatus for suppressing positive charging of wafer. In some cases, however, the ion implanter is not equipped or operated with such plasma flood gun, for example, a medium-current ion implanter that is generally used to provide a dosage of about 1E11~1E14 atoms/cm$^2$ and ion implant energy of about 10 KeV~500 KeV. Such medium-current ion implanters are typically employed to form lightly doped source/drain doping regions in the substrate.

FIG. 1 is a schematic plan view of layout of a photoresist implant mask 20 for implementing lightly doped drain (LDD) regions of high-voltage devices in an integrated circuit die. As shown in FIG. 1, the integrated circuit die 10 is surrounded with scribe lanes 12. A number of test key regions (not explicitly shown) are defined within the scribe lanes 12. Within the integrated circuit die 10, device ion wells, gate oxide layer, polysilicon gates, and shallow trench isolation (STI) region have been formed on the substrate such as a silicon substrate.

The photoresist implant mask 20, which masks a large surface area of the integrated circuit die 10, has small-area openings 22 located at the lower left-hand corner of the integrated circuit die 10. The openings 22 expose the substrate surface of the high-voltage (HV) devices such as HV NMOS devices to be doped with a medium-current ion implanter.

Since the high-voltage devices occupy relatively small part of the die area, the area of the exposed substrate surface through the openings 22 is therefore very small, typically about 0.2%~2% of the die area. It has been found that the small-area openings 22 of the photoresist implant mask 20 during the LDD ion implant process is the root cause of device damage such as polysilicon gate bursting.

In light of the above, there is a need to provide an improved method for making integrated circuits that is able to overcome the above-mentioned LDD doping-related charging damage. Such a method must not, however, introduce any undesired side effects such as decreased device performance or excessively high manufacturing costs.

Figure 2:
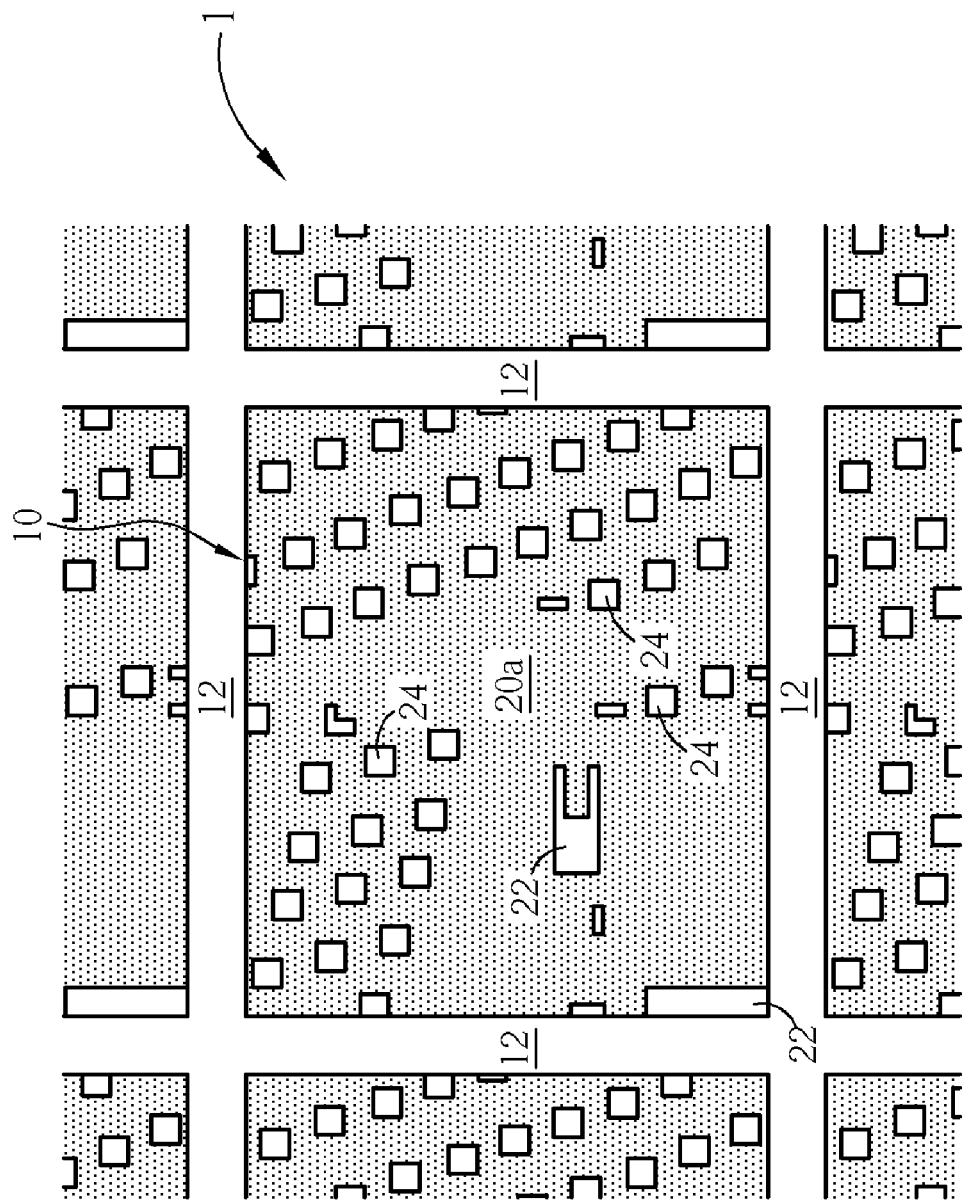
FIG. 2 is a schematic plan view of layout of a photoresist implant mask for implementing LDD regions of high-voltage devices in an integrated circuit die according to one preferred embodiment of the present invention.

Please refer to FIG. 2. FIG. 2 is a schematic plan view of layout of a photoresist implant mask 20a for implementing LDD regions of high-voltage devices in an integrated circuit die according to one preferred embodiment of the present invention, wherein like numerals designate like elements, regions or devices.

As shown in FIG. 2, a semiconductor wafer 1 comprises thereon a number of integrated circuit dies 10 and scribe lanes 12 that separate the integrated circuit dies 10. A number of test key regions (not explicitly shown) are defined within the scribing lanes 12. Within the integrated circuit die 10, device ion wells, gate oxide layer, polysilicon gates, and shallow trench isolation (STI) region have been formed on the substrate such as a silicon substrate.

The photoresist implant mask 20a comprises small-area openings 22 that expose the underlying substrate surface of the high-voltage (HV) devices such as HV NMOS devices to be doped with a medium-current ion implanter. The exposed substrate surface of the HV devices (hereinafter referred to as "exposed device substrate surface") through the openings 22 is typically source/drain region isolated by STI. The photoresist implant mask 20a further comprises dummy openings 24 distributed within the die 10 on the rest of the die area. The scribe lanes 12 may be partly masked. Alternatively, the scribe lanes may be completely clear and opened (not covered by photoresist implant mask 20a).

The dummy openings 24 are deliberately provided for increasing the exposed substrate surface during the LDD ion implant. According to the preferred embodiment, the dummy openings 24 expose non-device area of the substrate surface (hereinafter referred to as "exposed non-device substrate surface"). For example, these dummy openings 24 may encompass the STI dummy patterns used to reduce loading effect during the fabrication of STI. The sum of the exposed device substrate surface and the exposed non-device substrate surface during the LDD ion implant through the openings 22 and 24 is preferably larger than 5% of the die area.

It is advantageous to use the present invention because the additional dummy openings 24 increase the shunt path current flow through the substrate within the integrated circuit die 10, thereby reducing the likelihood of charging damage to the high-voltage devices during LDD ion implant.

Figure 3:
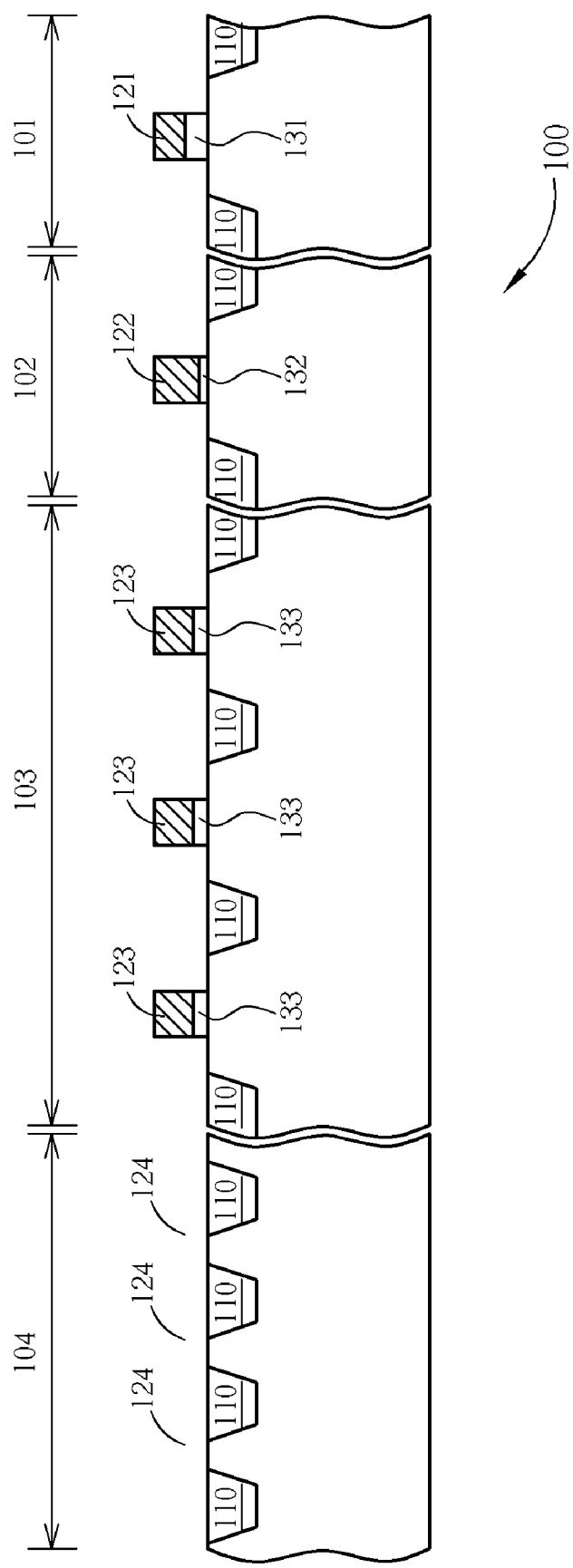
FIGS. 3-6 are schematic, cross-sectional diagrams showing the method of reducing charging damage to integrated circuits during semiconductor manufacturing in accordance with the preferred embodiment of the present invention.

FIGS. 3-6 are schematic, cross-sectional diagrams showing the method of reducing charging damage to integrated circuits during semiconductor manufacturing in accordance with the preferred embodiment of the present invention. As shown in FIG. 3, the semiconductor substrate 100 comprises thereon a high-voltage device region 101, a low-voltage device region 102, a medium-voltage device region 103, and a STI dummy region 104. STI structure 110 is formed in the surface of the semiconductor substrate 100 to electrically insulate electrical components fabricated on the surface of the semiconductor substrate 100. Device ion wells such as P well or N well are not shown.

Within the high-voltage device region 101, high-voltage MOS transistors such as, for example, 5V MOS transistor devices are to be formed therein. A gate electrode 121 of an exemplary high-voltage NMOS transistor is shown in the high-voltage device region 101. The gate electrode 121 is stacked on a thick gate oxide layer 131 and is insulated from the underlying semiconductor substrate 100. Within the low-voltage device region 102, low-voltage MOS transistors such as, for example, 1.8V MOS transistor devices are to be formed therein. A gate electrode 122 of an exemplary low-voltage NMOS transistor is shown in the low-voltage device region 102. The gate electrode 122 is stacked on a gate oxide layer 132 that is thinner than the gate oxide layer 131 and is insulated from the underlying semiconductor substrate 100. Within the medium-voltage device region 103, medium-voltage MOS transistors such as, for example, 3.3V MOS transistor devices are to be formed therein. Gate electrodes 123 of three exemplary low-voltage NMOS transistors are formed within the low-voltage device region 103. Each of the gate electrodes 123 is stacked on a gate oxide layer 133 and is insulated from the underlying semiconductor substrate 100. Within the STI dummy region 104, a plurality of STI dummy features 124 are provided, as previously mentioned, for the sake of loading effect during the fabrication of STI. The plurality of STI dummy features 124 provide exposed semiconductor substrate surface on which no active circuit or electrical component will be formed.

Figure 4:
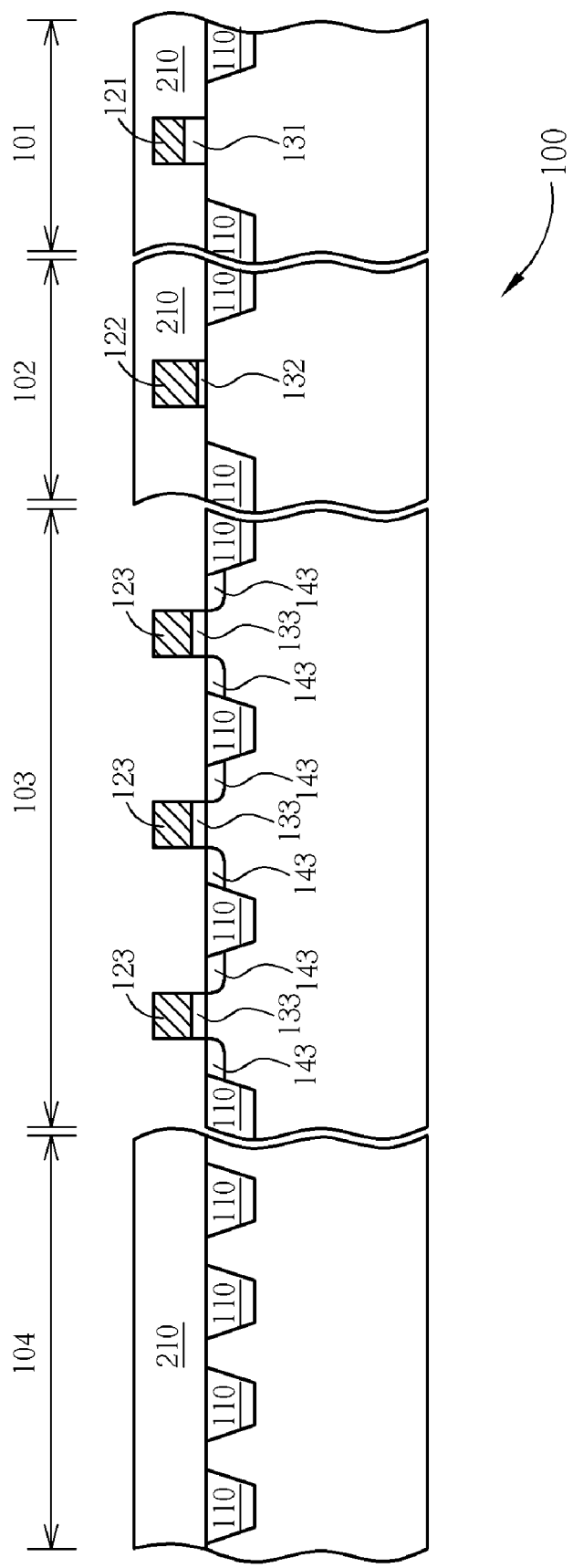

As shown in FIG. 4, an LDD implant photoresist mask 210 is formed over the semiconductor substrate 100. The LDD implant photoresist mask 210 covers the high-voltage device region 101, the low-voltage device region 102 and the STI dummy region 104, while exposing the medium-voltage device region 103. Since the medium-voltage device region 103 occupies a large part of the die area, a large surface area of the semiconductor substrate 100 within each die is exposed at this stage. The semiconductor substrate 100 is then subjected to an LDD ion implant process to implant dopants such as arsenic into the substrate, thereby forming LDD diffusion regions 143 in the medium-voltage device region 103. According to the preferred embodiment, in order to provide suitable dosages, the LDD ion implant process is carried out in a medium-current ion implanter without employing a plasma flood system or plasma flood gun. The LDD implant photoresist mask 210 is then stripped.

Figure 5:
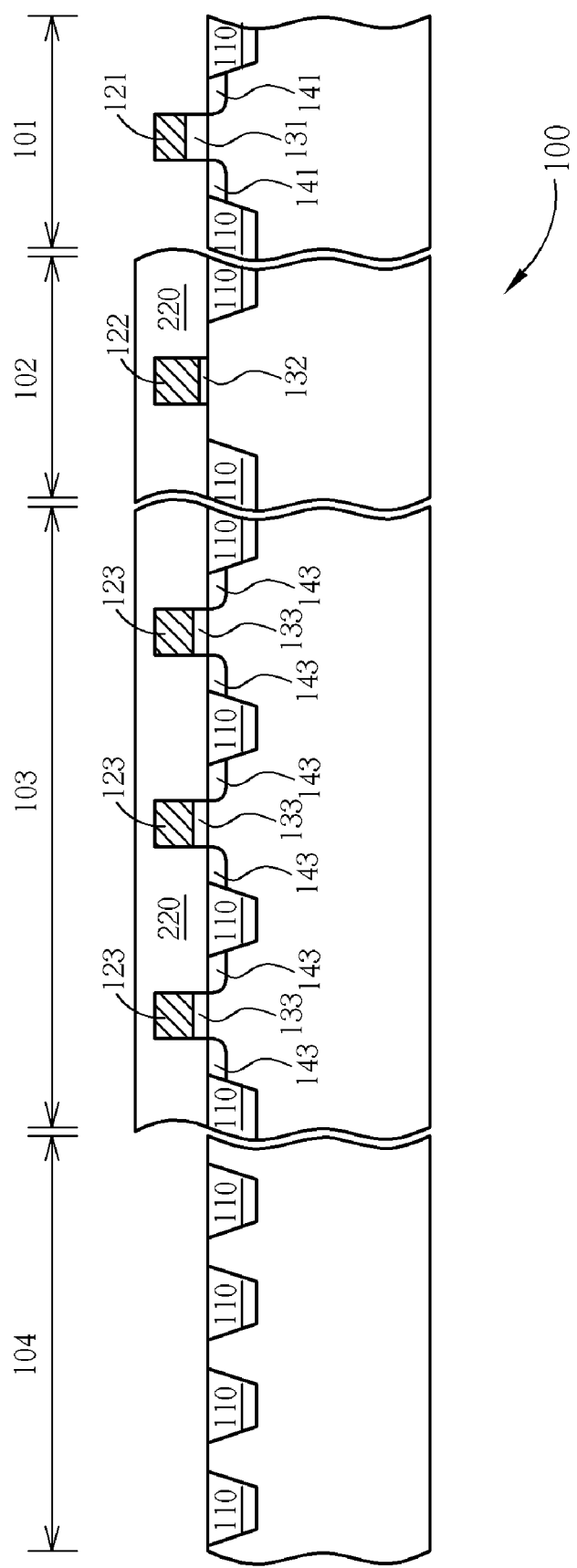

As shown in FIG. 5, another LDD implant photoresist mask 220 is formed over the semiconductor substrate 100. The LDD implant photoresist mask 220 covers the medium-voltage device region 103, the low-voltage device region 102, and exposes the high-voltage device region 101. As previously described, since the high-voltage devices occupy relatively small part of each die area, the exposed surface area of the high-voltage devices during the LDD implant is therefore very small, typically about 0.2%~2% of the die area. In order to increase the exposed surface area of the semiconductor substrate 100 during the LDD implant and to reduce charging damage, the STI dummy region 104 and the plurality of STI dummy features 124 are also exposed though the LDD implant photoresist mask 220.

By doing this, the total exposed surface area of the semiconductor substrate 100 within each die increases up to larger than 5% of each die area. The semiconductor substrate 100 is then subjected to another LDD ion implant process to implant dopants such as arsenic into the substrate, thereby forming LDD diffusion regions 141 in the high-voltage device region 101. According to the preferred embodiment, in order to provide suitable dosages, this LDD ion implant process is also carried out in a medium-current ion implanter without employing a plasma flood system or plasma flood gun. The LDD implant photoresist mask 220 is then stripped.

Figure 6:
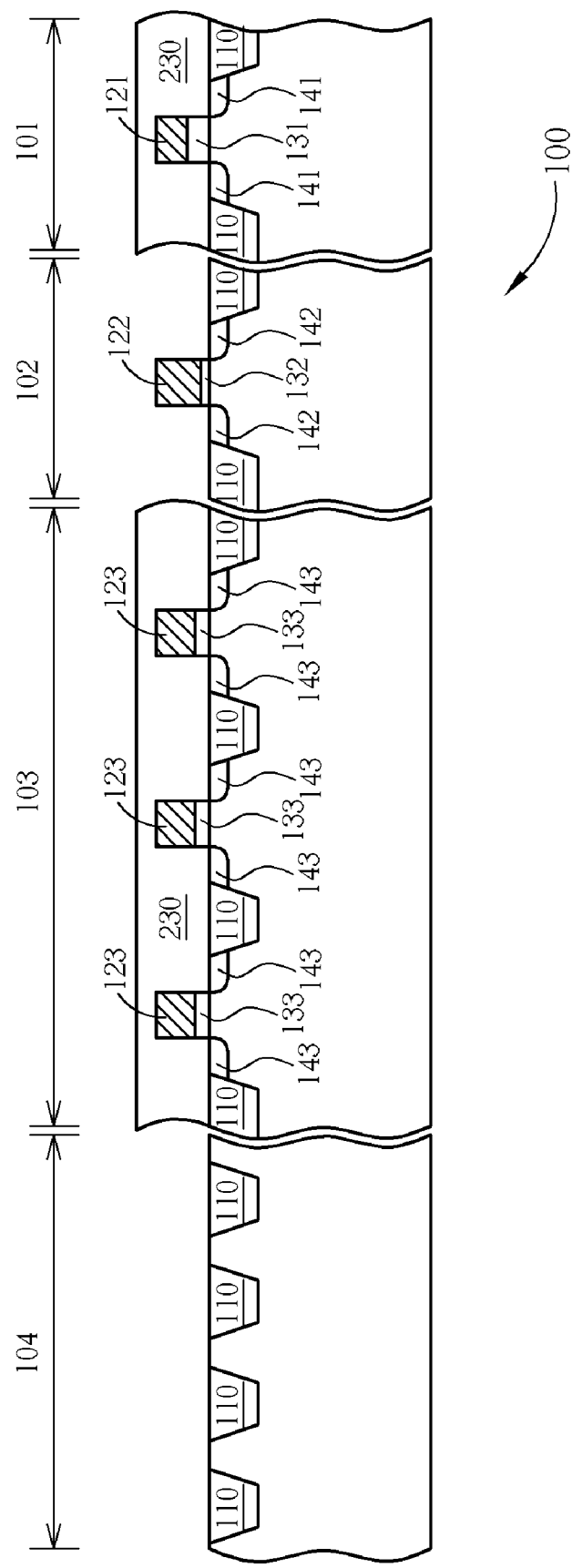

As shown in FIG. 6, still another LDD implant photoresist mask 230 is formed over the semiconductor substrate 100. The LDD implant photoresist mask 230 now covers the medium-voltage device region 103, the high-voltage device region 101, and exposes the low-voltage device region 102, and, optionally, the STI dummy region 104. If the exposed surface area of the high-voltage devices during the LDD implant is small, for example, less than 5% of the die area, the STI dummy region 104 and the plurality of STI dummy features 124 are exposed though the LDD implant photoresist mask 230.

Likewise, the semiconductor substrate 100 is subjected to an LDD ion implant process to implant dopants such as arsenic into the substrate, thereby forming LDD diffusion regions 142 in the low-voltage device region 102. According to the preferred embodiment, in order to provide suitable dosages, this LDD ion implant process is also carried out in a medium-current ion implanter without employing a plasma flood system or plasma flood gun. The LDD implant photoresist mask 230 is then stripped. The subsequent processes include sidewall spacer formation, heavily doped source/drain implant, and salicide processes are omitted. It is noted that the subsequent heavily doped source/drain implant is typically carried out using a high-current ion implanter.

It is to be understood that even the above exemplary embodiments reveal the present invention method of reducing charging damage to integrated circuits during LDD implant process of high-voltage MOS devices, this invention should not be limited thereto. The present invention may be applied in other applications such as for example plasma etching process. Furthermore, it is noted that the sequence of ion implanting the high-voltage device region 101, the low-voltage device region 102 and the medium-voltage device region 103 may be changed. For example, in accordance with another preferred embodiment, the LDD regions of the high-voltage device region 101 are implanted first.

FIGS. 7-10 are schematic cross-sectional diagrams illustrating a method of reducing charging damage to integrated circuits during plasma etching utilized in a dual damascene process in accordance with one exemplary embodiment of this invention.

Figure 7:
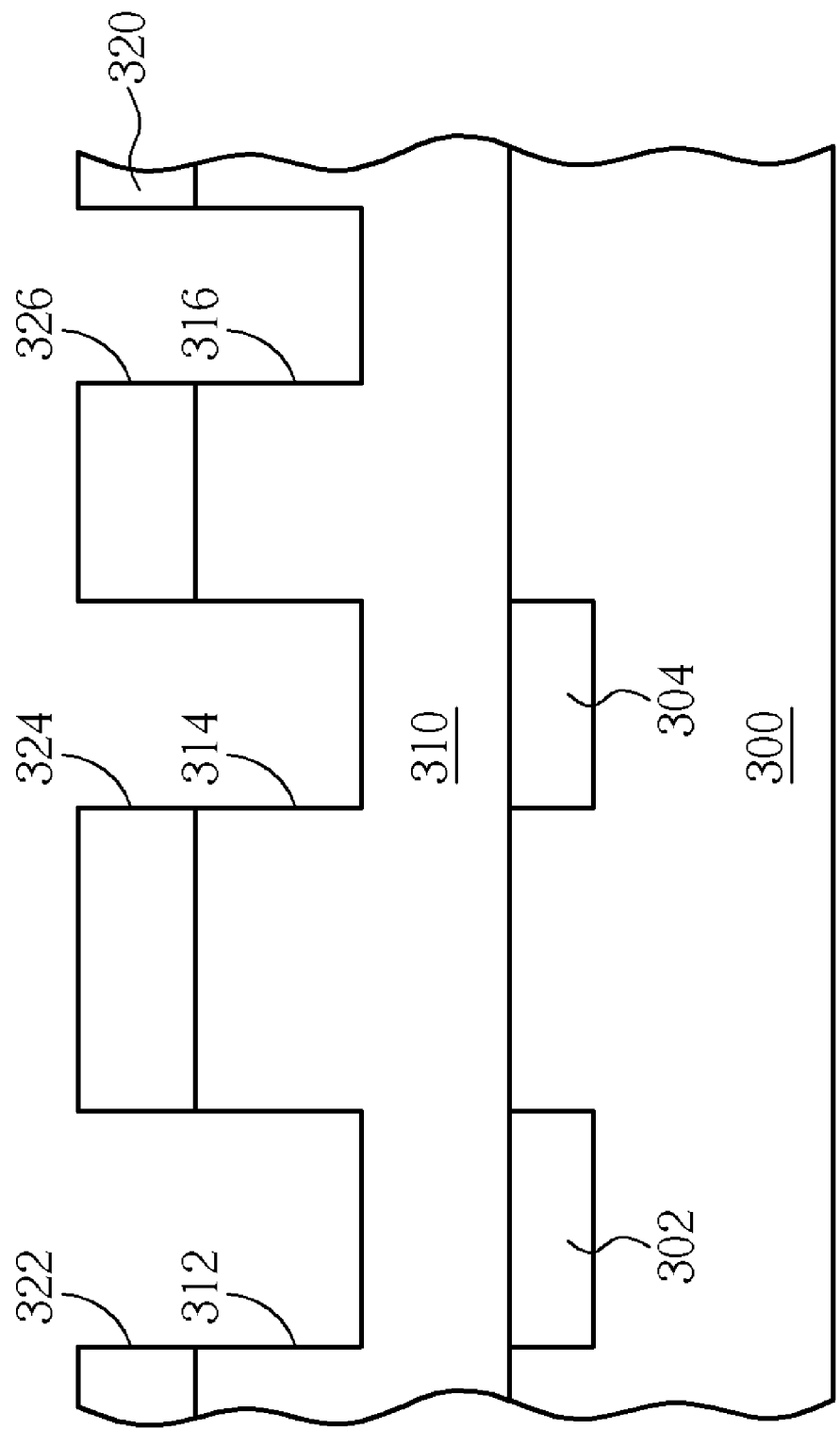
FIGS. 7-10 are schematic, cross-sectional diagrams showing the method of reducing charging damage to integrated circuits during semiconductor manufacturing in accordance with another preferred embodiment of the present invention.

As shown in FIG. 7, a substrate or a base layer 300 having thereon a conductive layer 302 and a conductive layer 304 is provided. The conductive layers 302 and 304 may be lower level metal wiring or doped diffusion regions. A dielectric layer 310 is deposited on the substrate 300 and covers the conductive layers 302 and 304. A photoresist layer 320 is coated on the dielectric layer 310. The photoresist layer 320 comprises an opening 322 and dummy openings 324 and 326, which are formed within each die area.

Subsequently, using the photoresist layer 320 as an etching hard mask, a plasma etching process is carried out to etch the dielectric layer 310 through the opening 322 and dummy openings 324 and 326 to form trench opening 312 and dummy trench openings 314 and 316 in the upper portion of the dielectric layer 310. The photoresist layer 320 is then removed. The trench opening 312 is directly above the conductive layer 302, while the dummy trench opening 314 is directly above the conductive layer 304.

The purpose of the dummy openings 324 and 326 is to increase the in-die shunt path current flow for the plasma etching process. It is recommended that the exposed surface area of the opening 322 and dummy openings 324 and 326 is higher than 5% of the die area.

Figure 8:
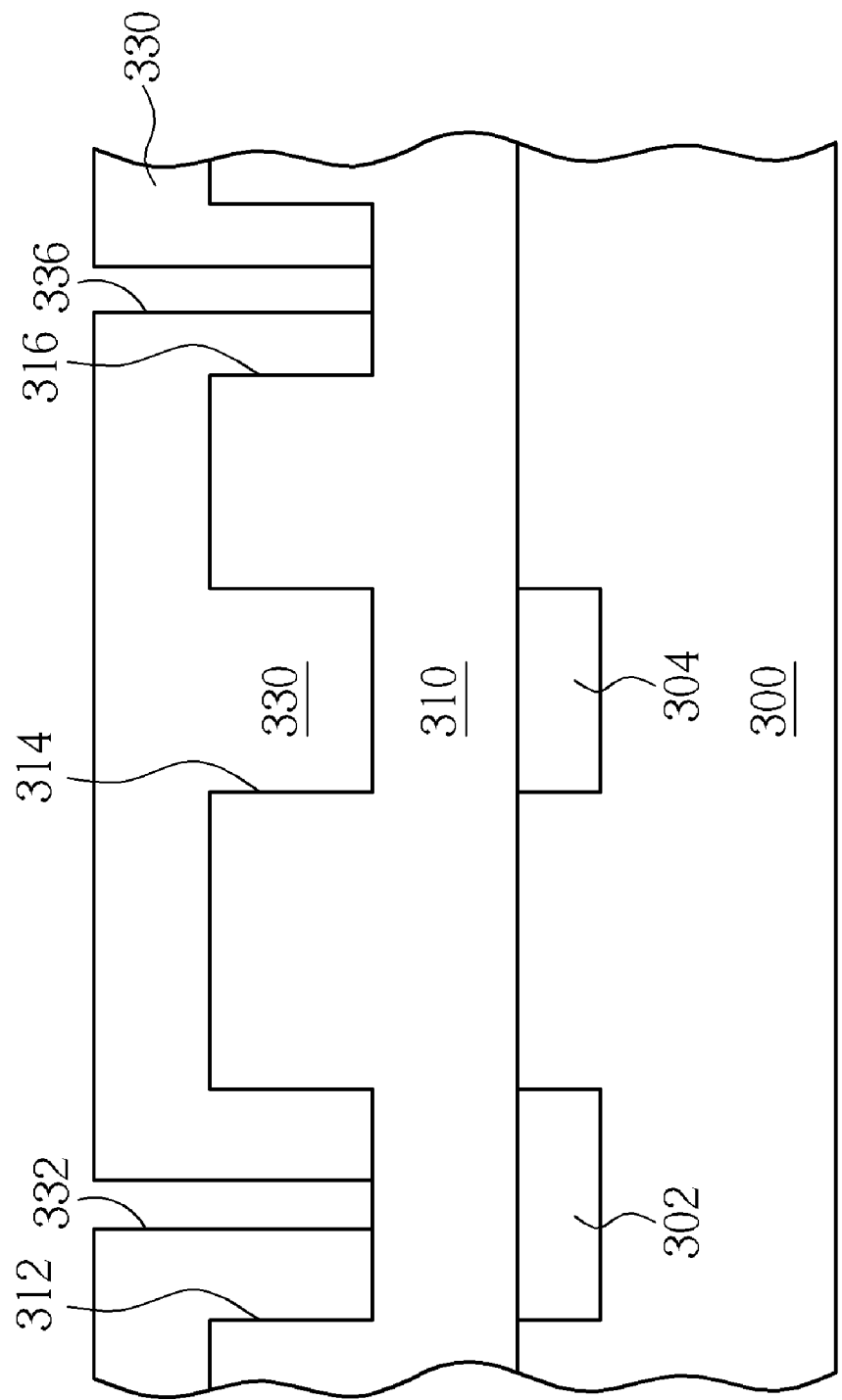

As shown in FIG. 8, after the formation of the trench opening 312 and dummy trench openings 314 and 316, a photoresist layer 330 is coated over the substrate 300. The photoresist layer 330 comprises an opening 322 that is directly above the trench opening 312 and a dummy opening 326 that is directly above the dummy trench opening 316. Since the conductive layer 304 is situated directly under the dummy trench opening 314, it is forbidden to provide any dummy opening on the dummy trench opening 314 in order to prevent communication between the dummy trench opening and the conductive layer 304.

Figure 9:
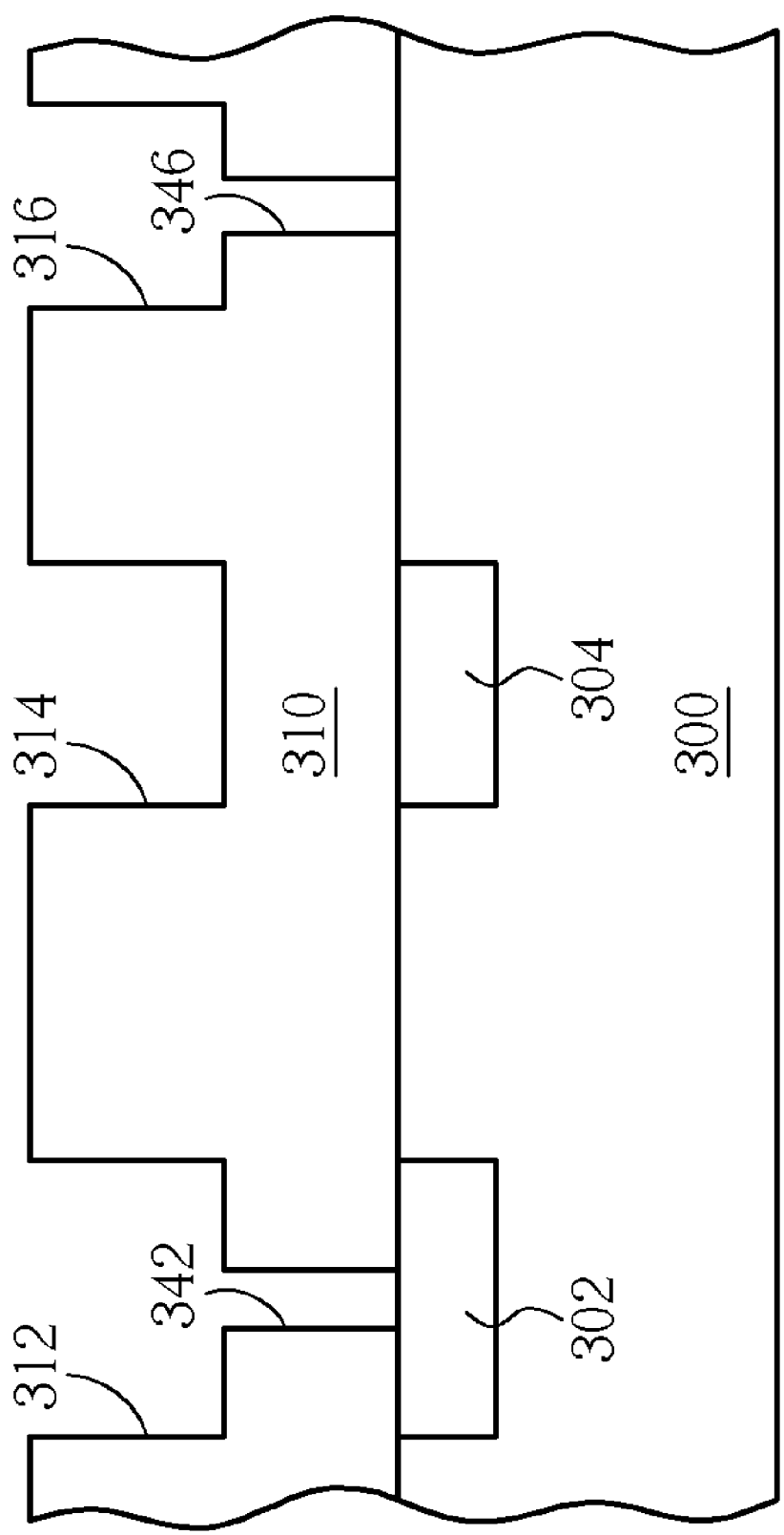

As shown in FIG. 9, using the photoresist layer 330 as an etching hard mask, another plasma etching process is carried out to etch the dielectric layer 310 through the opening 322 and dummy opening 326 to form via opening 342 and dummy via opening 346 in the lower portion of the dielectric layer 310. The photoresist layer 320 is then removed. Likewise, the purpose of the dummy opening 336 is to increase the in-die shunt path current flow during the plasma etching process.

Figure 10:
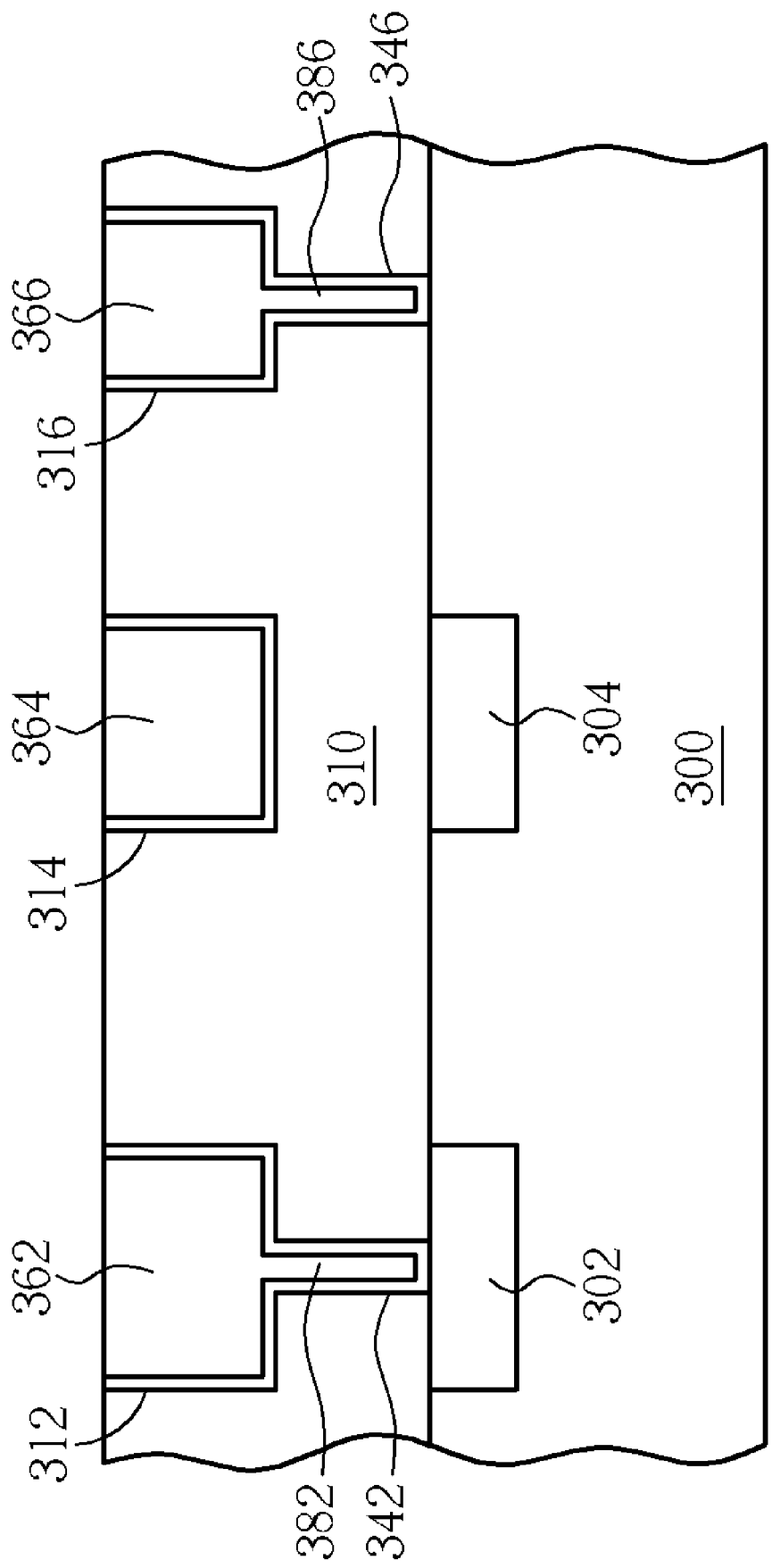

As shown in FIG. 10, using methods known to this industry, copper wiring 362 and copper via 382 are formed within the trench opening 312 and via opening 342, respectively. Concurrently, dummy copper features 364, 366 and 386 are formed within the dummy trench openings 314, 316 and dummy via opening 346, respectively. According to the preferred embodiment, the dummy copper features 364, 366 and 386 are floating. Alternatively, the dummy copper feature 366 and 386 may be grounded to the substrate.

The above exemplary embodiment is known as trench-first dual damascene process. It is understood that the present invention is also suited for other damascene processes such as via-first processes or any plasma etching processes where charge damage due to plasma etching is an issue. For example, this invention is also suited for contact hole etching process.

Figure 11:
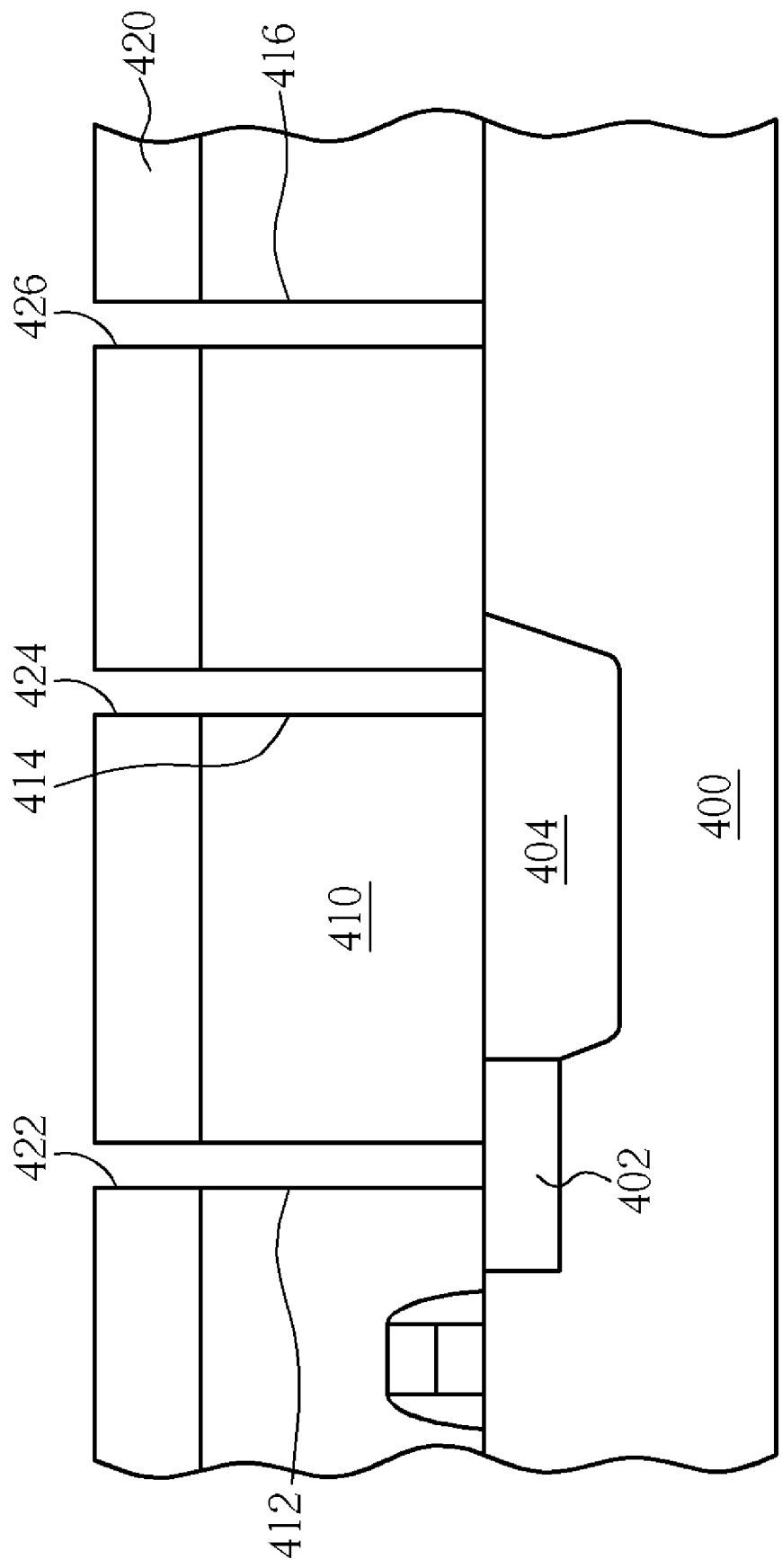
FIG. 11 illustrates another embodiment of this invention.

FIG. 11 illustrates another embodiment of this invention. As shown in FIG. 11, a semiconductor substrate 400 such as a silicon substrate having thereon a diffusion region 402 is provided. A dielectric layer 410 is deposited on the semiconductor substrate 400. A photoresist layer 420 is coated on the dielectric layer 410. The photoresist layer 420 comprises opening 422 and dummy openings 424 and 426. Using the photoresist layer 420 as an etch hard mask, a plasma dry etching process is carried to etch the dielectric layer 410 through the opening 422 and dummy openings 424 and 426, thereby forming contact hole 412 and dummy holes 414 and 416.

The contact hole 412 communicates with the underlying diffusion region 402 of a semiconductor device such as a transistor. The dummy openings 424 and 426 expose non-active regions such as shallow trench isolation (STI) region 404. The dummy holes 414 and 416 increase the in-die shunt path current flow during the plasma etching of the contact hole. It is recommended that the exposed surface area of the opening 422 and dummy openings 424 and 426 is higher than 5% of the die area.

Figure 12:
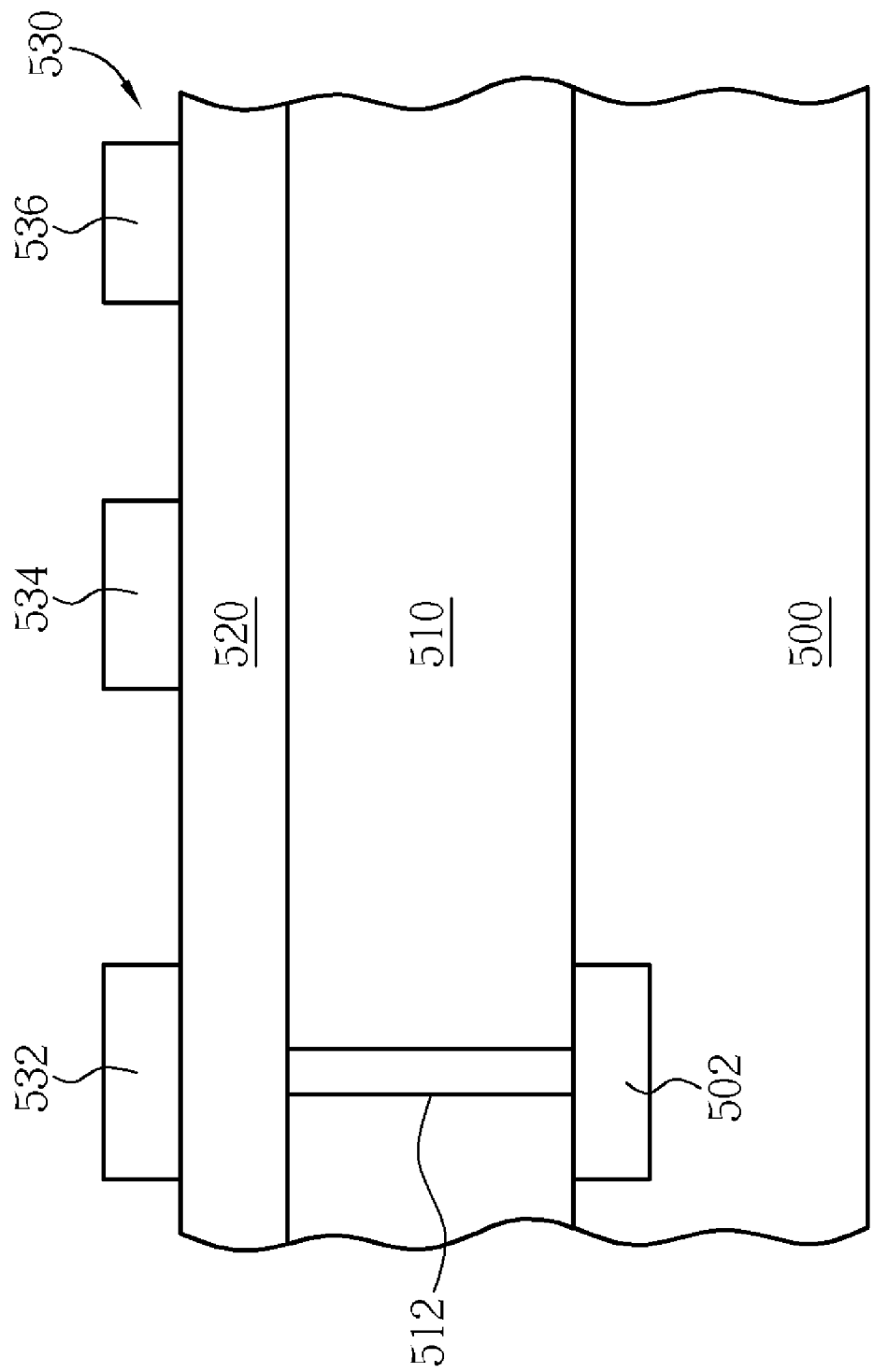
FIGS. 12-13 illustrates still another embodiment of this invention.
Figure 13:
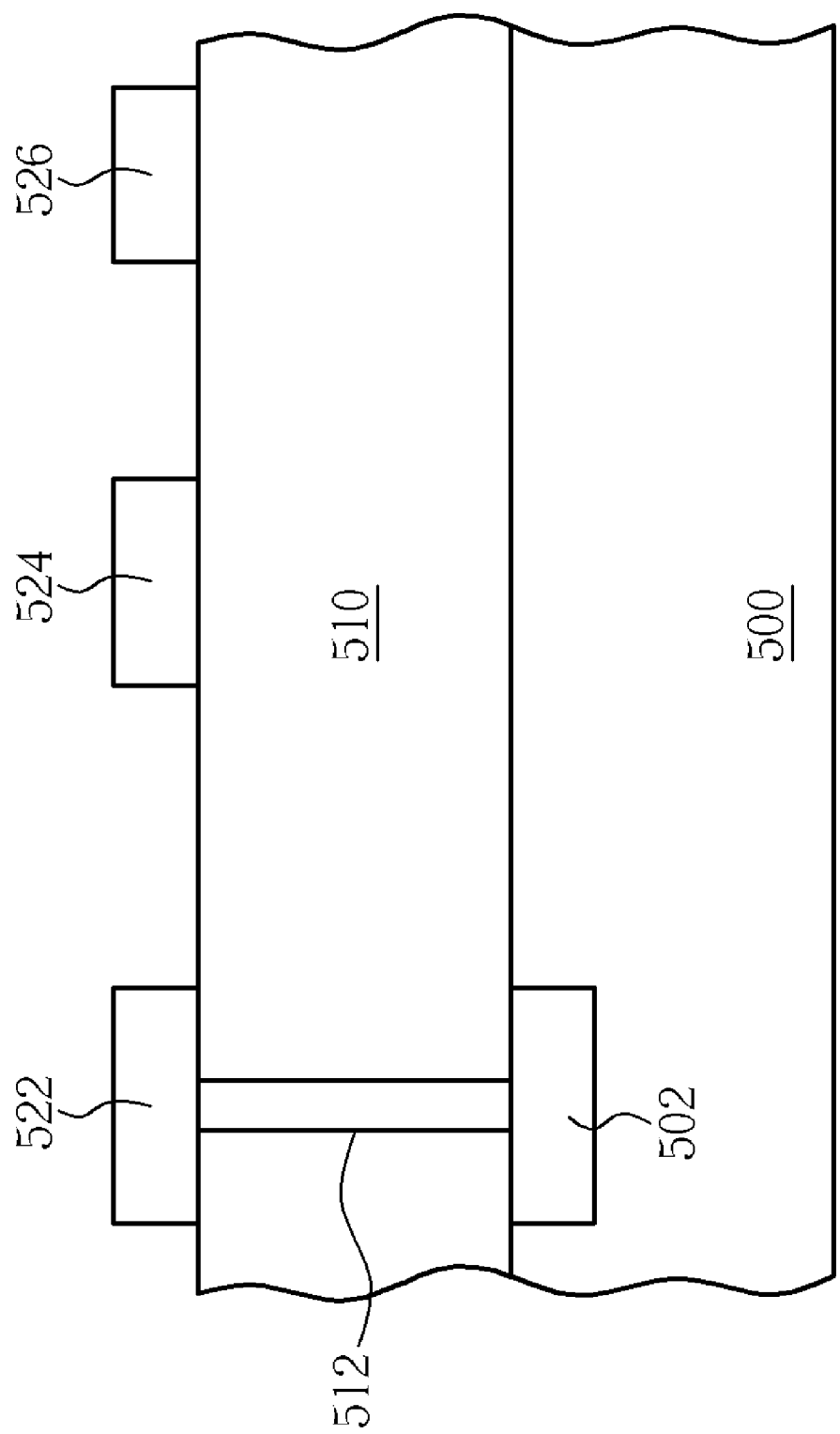

FIGS. 12-13 illustrates another embodiment of this invention. As shown in FIG. 12, a substrate or base layer 500 is provided. A conductive layer 502 is provided in the base layer 500. The conductive layer 502 may be a lower level metal wiring. A dielectric layer 510 is deposited on the base layer 500. A via 512 is formed in the dielectric layer 510. A metal layer 520 such as aluminum layer is formed on the dielectric layer 510. A photoresist layer 530 is coated on the metal layer 520. The photoresist layer 530 is then patterned using conventional lithographic methods to form interconnection pattern 532 and dummy patterns 534 and 536.

As shown in FIG. 13, using the interconnection pattern 532 and dummy patterns 534 and 536 as an etch hard mask, a plasma dry etching process is carried out to etch the metal layer 520 that is not covered with the interconnection pattern 532 and dummy patterns 534 and 536, thereby forming interconnection wiring 522 and dummy features 524 and 526. These dummy features 524 and 526 increase the in-die shunt path current flow during the subsequent plasma enhanced chemical vapor deposition (PECVD) process and help to reduce charge damage.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for reducing charging damage to integrated circuits during semiconductor manufacturing, comprising:
   providing a semiconductor substrate comprising thereon a number of integrated circuit dies, said integrated circuit dies being separated from each other by scribe lanes surrounding each said integrated circuit die, wherein said semiconductor substrate comprises thereon a dielectric layer;
   forming a mask over said dielectric layer, said mask comprising an interconnect opening and a dummy, non-interconnect opening, wherein said interconnect opening and said dummy, non-interconnect opening both are formed within each said integrated circuit die;
   performing a plasma etching process to etch said dielectric layer through said interconnect opening and said dummy, non-interconnect openings of said mask, thereby forming an interconnect recessed trench and a dummy recessed trench in said dielectric layer; and
   filling said interconnect recessed trench and said dummy recessed trench with conductive materials to form an interconnect feature and a dummy, non-interconnect feature, wherein said interconnect feature electrically connects to an underlying conductive layer, while said dummy, non-interconnect feature is floating or grounded to said semiconductor substrate;
   wherein said dummy, non-interconnect opening increases an in-die shunt path current flow during said plasma etching process, thereby reducing charge damage to said integrated circuit dies.

2. The method according to claim 1 wherein an exposed surface area of said interconnect and dummy, non-interconnect openings is higher than 5% of a die area of each said integrated circuit die.

3. The method according to claim 1 wherein said mask comprises photoresist.

4. The method according to claim 1 wherein said interconnect recessed trench is a damascene opening.

5. The method according to claim 1 wherein said interconnect recessed trench is a contact hole.

6. The method according to claim 1 wherein said underlying conductive layer comprises metal wiring and diffusion region.

* * * * *